United States Patent [19]

Suzuki

[11] Patent Number: 6,027,841
[45] Date of Patent: Feb. 22, 2000

[54] CHARGED-PARTICLE-BEAM PROJECTION-EXPOSURE METHOD EXHIBITING ABERRATION REDUCTION THROUGH MULTIPLE DEFLECTOR USE

[75] Inventor: Shohei Suzuki, Tokyo, Japan

[73] Assignee: Nikon Corporation, Tokyo, Japan

[21] Appl. No.: 09/209,643

[22] Filed: Dec. 10, 1998

[30] Foreign Application Priority Data

Dec. 10, 1997 [JP] Japan ................................... 9-356374

[51] Int. Cl.$^7$ ....................................................... G03F 9/00
[52] U.S. Cl. ............................................. 430/30; 430/296
[58] Field of Search ...................................... 430/30, 296

[56] References Cited

U.S. PATENT DOCUMENTS 5,635,719  6/1997  Petric ...................................... 250/396

OTHER PUBLICATIONS

Koikari et al., "Numerical Calculation on Optical System for EB Projection," Microprocess '96, The 9$^{th}$ Int'l Microprocess Conf., Jul. 8–11, 1996.

Saitou et al., "A High–Speed, High–Precision Electron Beam Lithography System (Electron Optics)," *J. Vac. Sci. Technol.* 3:98–101 (1985).

Zhu et al., "Dynamic Corrections of Aberrations in Focusing and Deflection Systems with Shaped Beams," *SPIE* 2522:66–77 (1995).

*Primary Examiner*—Christopher G. Young
*Attorney, Agent, or Firm*—Klarquist Sparkman Campbell Leigh & Whinston, LLP

[57] ABSTRACT

Charged-particle-beam transfer-exposure apparatus are disclosed exhibiting reduced hybrid distortion. A charged particle beam passes through a mask and through a projection-lens assembly to form an image of a selected mask region on a wafer. Signals corresponding to the functions $d_{x1}(X_w, Y_w, Z, I, s)$, $d_{y1}(X_w, Y_w, Z, I, s)$, $d_{x2}(X_w, Y_w, Z, I, s)$, $d_{y2}(X_w, Y_w, Z, I, s)$, ..., are generated by a computer and routed to respective deflectors to minimize deflection aberrations, wherein $X_w, Y_w$ are the coordinates of the deflected transfer region on the wafer, Z is the wafer height, I is the beam current passing through the pattern area in a mask region, and s is a variable pertaining to scattering of charged particles in the pattern. The signals routed to the various deflectors also take into account the function $g(X_w, Y_w, Z, I, s)$ which corrects deflection distortion.

8 Claims, 3 Drawing Sheets

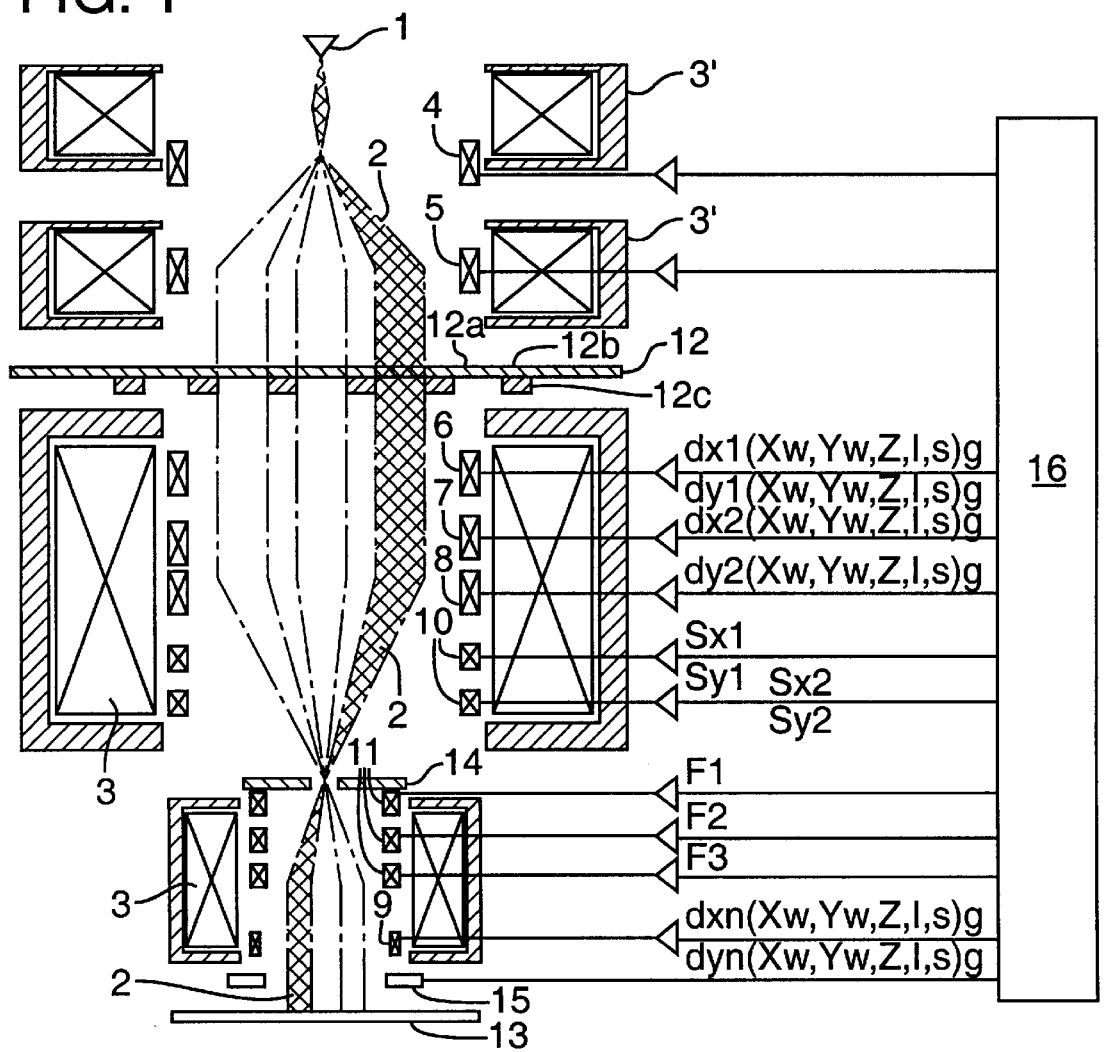

CHARGED-PARTICLE-BEAM PROJECTION-EXPOSURE METHOD EXHIBITING ABERRATION REDUCTION THROUGH MULTIPLE DEFLECTOR USE

FIELD OF THE INVENTION

This invention pertains to microlithography apparatus employing a charged particle beam (e.g., electron beam or ion beam) for projection-exposure of a mask or reticle pattern onto a sensitive substrate. Such apparatus are used, for example, in the manufacture of semiconductor integrated circuits, displays, and the like.

BACKGROUND OF THE INVENTION

Much research and development effort has been expended recently in the quest to produce a charged-particle-beam (CPB) projection-exposure apparatus exhibiting both high resolution and high throughput. Contemporary CPB projection-exposure systems that provide high throughput are termed "batch-transfer" systems, with which a single die (one chip) or even multiple dies are simultaneously exposed onto the sensitive substrate. Unfortunately, batch-transfer systems have substantial problems. For example, a mask or reticle suitable for a batch-transfer system is typically very complex and preparing such a mask or reticle is extremely difficult. Another serious problem is that exposing an entire die in one "shot" requires an extremely large optical field in which substantial aberrations are typically present, especially in off-axis regions of the optical field. Aberrations in such large optical fields are extremely difficult to reduce satisfactorily to within the tight specifications normally required for accurate pattern transfer. Consequently, interest in batch-transfer systems has declined.

Another type of projection-exposure apparatus that has been under intensive development recently is the "divided" projection-exposure system in which the entire mask pattern is projection-exposed not simultaneously but rather in portions. The mask or reticle used with such a system is "segmented" into multiple "mask subfields" or other regions each defining a separate respective portion of the mask pattern. The mask subfields are individually projection-exposed sequentially onto corresponding regions on the sensitive substrate on which the resulting images are "stitched" together. Sequentially exposing all the mask subfields of a die results in reproduction of the entire mask pattern on the substrate. Since projection-exposure is performed subfield-by-subfield (or otherwise region-by-region), the optical field can be much smaller than the very large optical field required in a batch-transfer system. The smaller optical field required for divided projection-exposure generally allows better correction of aberrations (e.g., variability in focal plane, distortion, etc.) than batch-transfer systems. Thus, a divided projection-exposure system can perform projection-exposure with better resolution across an optically wide field, and more accurately and completely correct aberrations, compared to batch-transfer systems.

Certain conventional aspects of divided projection-exposure are shown in FIGS. 2(a)–2(b), in which item 100 is a mask (synonymous herein with "reticle"), item 100a is a mask subfield (as a representative region of the mask), item 100b is a boundary region situated between adjacent mask subfields 100a, item 110 is a sensitive substrate (e.g., semiconductor wafer) to the surface of which a resist has been applied, item 110a is a one-die (one chip) field on the sensitive substrate 110, item 110b is an individual "transfer subfield" (as a representative corresponding exposed region) on the sensitive substrate 110 corresponding to a respective mask subfield 100a, AX is the optical axis of the CPB optical system, EB is the charged particle beam, and CO is a crossover point of the CPB optical system.

The mask 100 comprises a membrane divided into multiple mask subfields 100a each comprising a respective portion of a mask pattern to be transferred to the sensitive substrate 110. The mask subfields 100a are delineated by boundary regions 100b that do not define any portion of the overall mask pattern. The mask 100 typically comprises a support grid (not shown, but typically situated on the downstream-facing surface of the mask 100) typically configured as intersecting struts coextensive with the boundary regions 100b. The support grid provides the membrane with thermal stability and physical strength.

If the sensitive substrate 110 is manufactured from a semiconductor material (e.g., silicon), the substrate typically has a profile as shown generally in FIG. 2(b). FIG. 2(b) shows a portion of the sensitive substrate 110 (area "Va").

In FIG. 2(a), a z-axis extends parallel to the optical axis AX of the CPB optical system, and the x- and y-axes extend parallel to the directions in which the mask subfields 100a are arrayed. The respective pattern portions defined by a row of subfields 100a are sequentially transferred by step-wise scanning the charged particle beam EB in the y-axis direction. To project a subsequent adjacent row of subfields, the mask 100 and sensitive substrate 110 are moved in opposite directions along the x-axis, as denoted by arrows Fm and Fw. Such scanning of the charged particle beam EB in the y-axis direction and movement of the mask 100 and substrate 110 in the x-axis direction are repeated until an entire die has been transferred. Then, the substrate 110 is moved to position the next die for exposure, and the mask 100 is exposed again subfield-by-subfield as described above.

The scanning sequence of mask subfields 100a and the transfer sequence onto the sensitive substrate 110 are denoted by arrows Am and Aw, respectively. The mask 100 and sensitive substrate 110 are moved in opposite directions along each of the x- and y-axes because these axes are inverted on the substrate 110 (relative to the mask 100) by passage of the charged particle beam EB through a pair of projection lenses (not shown, but situated between the mask 100 and substrate 110).

The boundary regions 100b separating the mask subfields 100a from one another do not define any portion of the mask pattern and thus are not transferred to the substrate 110. Hence, the positions of the transfer subfields 100b must be shifted sufficiently during projection-exposure to allow the transfer subfields to be "stitched" together on the substrate surface without any intervening gaps. To such end, the charged particle beam EB is laterally shifted, during projection-exposure of each mask subfield 100a, in the y-axis direction by an amount equal to the width Ly of the boundary region 100b. A similar type of correction is made in the x-axis direction by simultaneously shifting the mask 100 and substrate 110 by relative amounts taking into consideration the demagnification ratio of the combined projection lenses. Also, whenever transfer of a particular row of mask subfields 100a is completed and it is necessary to shift to the next row, the charged particle beam EB is shifted in the x-axis direction by an amount equal to the width Lx of the boundary region 100b. As a result, the transfer subfields 110b are formed contiguously on the substrate 110 without any intervening boundary regions or other gaps.

The segmented mask 100 typically includes a support grid (not shown in FIGS. 2(a)–2(b)) comprising intersecting struts that are coextensive with the boundary regions 100b. Thus, the support grid, along with the network of boundary regions 100b, separates the mask subfields 100a (or analogous regions) from one another. The support grid renders the mask 100 resistant to warping and thermal distortion including such warping and distortion caused by irradiation of the mask by the charged particle beam EB.

An example of a conventional divided projection-exposure apparatus is shown in FIG. 3. The FIG. 3 apparatus comprises a charged-particle source 1 that produces a charged particle beam 2; an illumination-lens assembly 3'; deflectors 4, 5; a projection-lens assembly 3; a contrast aperture 14; and a computer 16. The apparatus receives a mask 12 comprising multiple mask subfields 12a (or analogous regions) each defining a respective very small portion of the mask pattern (in FIG. 3, the mask subfield 12a corresponds with the mask subfield 100a shown in FIG. 2(a)). The mask subfields 12a are separated from one another by boundary regions 12b that define no portion of the mask pattern (the boundary region 12b corresponds with the boundary region 100b shown in FIG. 2(a)). The mask 12 further comprises a support grid 12c situated in the boundary regions 12b. The FIG. 3 apparatus is also usable with a substrate ("wafer") 13.

In FIG. 3, the electron beam 2 propagates generally along a z-axis extending vertically in the figure. X- and y-axis directions extend orthogonally with respect to the z-axis.

A conventional divided projection-exposure apparatus such as that of FIG. 3 typically also includes any of various deflectors (not shown) in association with the projection-lens assembly 3 that serve to provide, inter alia, automatic correction of deflection aberrations. Such deflectors are discussed below.

Referring further to FIG. 3, the charged particle beam 2 is emitted from the charged-particle source 1 and is shaped into a collimated beam by the illumination-lens assembly 3' for illumination of the selected region of the mask 12. So as to illuminate a single preselected mask subfield 12a, the charged particle beam 2 is appropriately deflected laterally by the deflectors 4, 5. For example, in FIG. 3, the cross-hatched area represents the charged particle beam irradiating a mask subfield 12a located on the right side of the mask. By changing the excitation current or voltage (depending upon whether the deflectors 4, 5 are electromagnetic or electrostatic, respectively) applied to the deflectors 4, 5, a more centrally located mask subfield 12a can be irradiated or, alternatively, a mask subfield 12a located on the left side of the mask can be irradiated.

The charged particle beam 2 that has passed through the selected region 12a of the mask passes through the projection-lens assembly 3 to form a pattern-feature image of the irradiated mask region on the wafer 13. The contrast aperture 14 is situated at a back-focal plane of the upstream projection lens 3 to block scattered charged particles from areas outside the pattern features.

To place the image of the irradiated mask region at the proper location on the wafer 13 and to reduce aberrations caused by deflection of the beam, the charged particle beam is appropriately deflected by deflectors (not shown) located downstream of the mask 12. Thus, the transfer subfields are formed contiguously and finely on the wafer 13 to form the mask pattern on the wafer 13.

CPB projection-optical apparatus (such as an apparatus shown generally in FIG. 3) are known that employ a dynamic compensator in association with the projection-optical system. In this regard, reference is made to Saitou et al., "A High-Speed, High-Precision Electron Beam Lithography System (Electron Optics)," *J. Vac. Sci. Technol.* B3(1):98–101, 1985. In this paper (specifically FIG. 1 of the paper), an objective lens (analogous to a projection-optical lens system) is situated between the mask and the substrate. The projection-optical lens system has associated therewith a dynamic compensator comprising a dynamic-focus coil and a stigmator coil. The dynamic-focus and stigmator coils are energized with respective excitation currents according to respective signals generated by a computer or the like. Each respective excitation current is a function of the beam position in the transverse (x-y) plane (i.e., of deflection position of the beam).

Reference is also made to U.S. Pat. No. 5,653,719 to Petric which discusses a different approach to reducing aberrations caused by deflection. Specifically, according to Petric, electron-beam optics are provided in which respective lens axes are shifted as a function of the respective beam position along the beam path, so as to follow the central ray of the beam as it is deflected through the respective lenses. Various deflectors in association with the projection-optical system are employed for this purpose.

Conventional methods and apparatus for correction of beam position and of aberrations exhibit generally satisfactory performance whenever the size of the mask subfields (or analogous irradiated regions of the mask) is small, i.e., at most several micrometers square. However, whenever the irradiated mask regions are larger (e.g., several hundreds of micrometers square), the conventional methods and apparatus do not exhibit satisfactory performance, especially in view of the increasing demands of pattern resolution required recently.

For example, in divided projection-exposure systems, aberrations other than main-field distortion, such as "hybrid blurs" and "hybrid distortions" (which are ignored in the FIG. 3 apparatus) become problematic. "Hybrid blurs" are aberrations the magnitudes of which depend on the aperture half-angle, position within the irradiated region, and the center position of the deflected region. "Hybrid distortions" are aberrations the magnitudes of which depend on the position within the irradiated region subfield and the center position of the deflected region.

In divided projection-exposure apparatus, hybrid blurs and hybrid distortion can have a magnitude of several tens of nm, and conventional methods as summarized above are inadequate for making the required corrections with respect to, inter alia, hybrid blur and hybrid distortion.

SUMMARY OF THE INVENTION

This invention is intended to resolve the problems summarized above and to provide divided charged-particle-beam (CPB) projection-exposure apparatus exhibiting reduced hybrid blur and hybrid distortion, especially with such apparatus and methods in which the imaged regions are larger than several micrometers square.

The object is achieved by CPB projection-exposure apparatus according to the invention adapted to receive a mask placed in a CPB trajectory in a column comprising a CPB illumination-lens assembly and projection-lens assembly. In general, the mask pattern defined by the mask comprises a field that is divided into multiple mask regions. To reproduce the field pattern on a sensitive substrate, individual mask regions are illuminated (irradiated) in a sequential manner using the charged particle beam. To irradiate a desired mask region, the beam is appropriately deflected using deflectors that are situated upstream of the mask. Downstream of the mask, an image of the irradiated mask region is formed and transferred onto a sensitive surface of an appropriate substrate (termed herein a "wafer"). The positions on the substrate surface at which the projected mask-region images (i.e., the "transfer regions") are located is controlled using multiple deflectors situated downstream of the mask. The transfer regions are linked together contiguously on the substrate surface to reproduce the mask pattern on the substrate.

A CPB projection-exposure apparatus according to a first representative embodiment of the invention is operable to determine the respective excitation current or voltage (as applicable) to be applied to individual deflectors located downstream of the mask. The respective current or voltage is determined according to a first function that corrects substantially all aberrations except for deflection distortion and a second function that corrects deflection distortion. The first function is of certain independent variables including the x- and y-axis position of the corresponding transfer region on the wafer, the "height" (i.e., position along a z-axis) of the wafer, the beam current passing through the respective pattern portion located inside the irradiated mask region, and a measure of the dispersion of pattern features located inside the irradiated mask region.

According to a second representative embodiment, the respective current or voltage is determined according to a first function that corrects substantially all aberrations except for deflection distortion and a second function that corrects deflection distortion. The first function is of certain independent variables including the x- and y-axis position of the irradiated mask region, the height of the wafer, the beam current passing through the respective pattern portion defined by the irradiated mask region, and a measure of the dispersion of pattern features located inside the irradiated mask region.

Since the x- and y-axis position of the transfer region on the wafer surface preferably has a 1:1 correlation to the x- and y-axis position of the corresponding irradiated mask region, similar action and effect can be obtained using the position of the mask region in place of the position of the corresponding transfer region on the wafer as an independent variable.

According to a third representative embodiment, the respective current or voltage is determined according to a first function that corrects substantially all aberrations except for deflection distortion and a second function that corrects deflection distortion. The first function is of certain independent variables including the x- and y-axis position of the mask region and the height of the wafer.

Since the density of the beam current irradiating the mask is known by measurement in many cases, the beam current passing through a particular pattern area within an irradiated mask region can be determined from the percentage of the area of the region represented by actual pattern features. Also, the measure of the dispersion of pattern features located inside the irradiated mask region can be found from the pattern distribution within that region. This allows, in the third representative embodiment, two independent variables to be omitted as being subordinate to the position of the mask region. However, in such an embodiment, it is typically necessary to re-determine the first function every time the mask is changed.

Adjusting the current or voltage applied to respective deflectors, according to the invention, allows hybrid blur and hybrid distortion to be maintained at an extreme minimum in divided projection-exposure apparatus.

The foregoing and additional features and advantages of the invention will be more readily apparent from the following detailed description, which proceeds with reference to the accompanying drawings.

BRIEF DESCRIPTION OF THE DRAWINGS

FIG. 1 is a schematic elevational view of a representative embodiment of a divided projection-exposure apparatus according to the invention.

DETAILED DESCRIPTION

Figure 3:
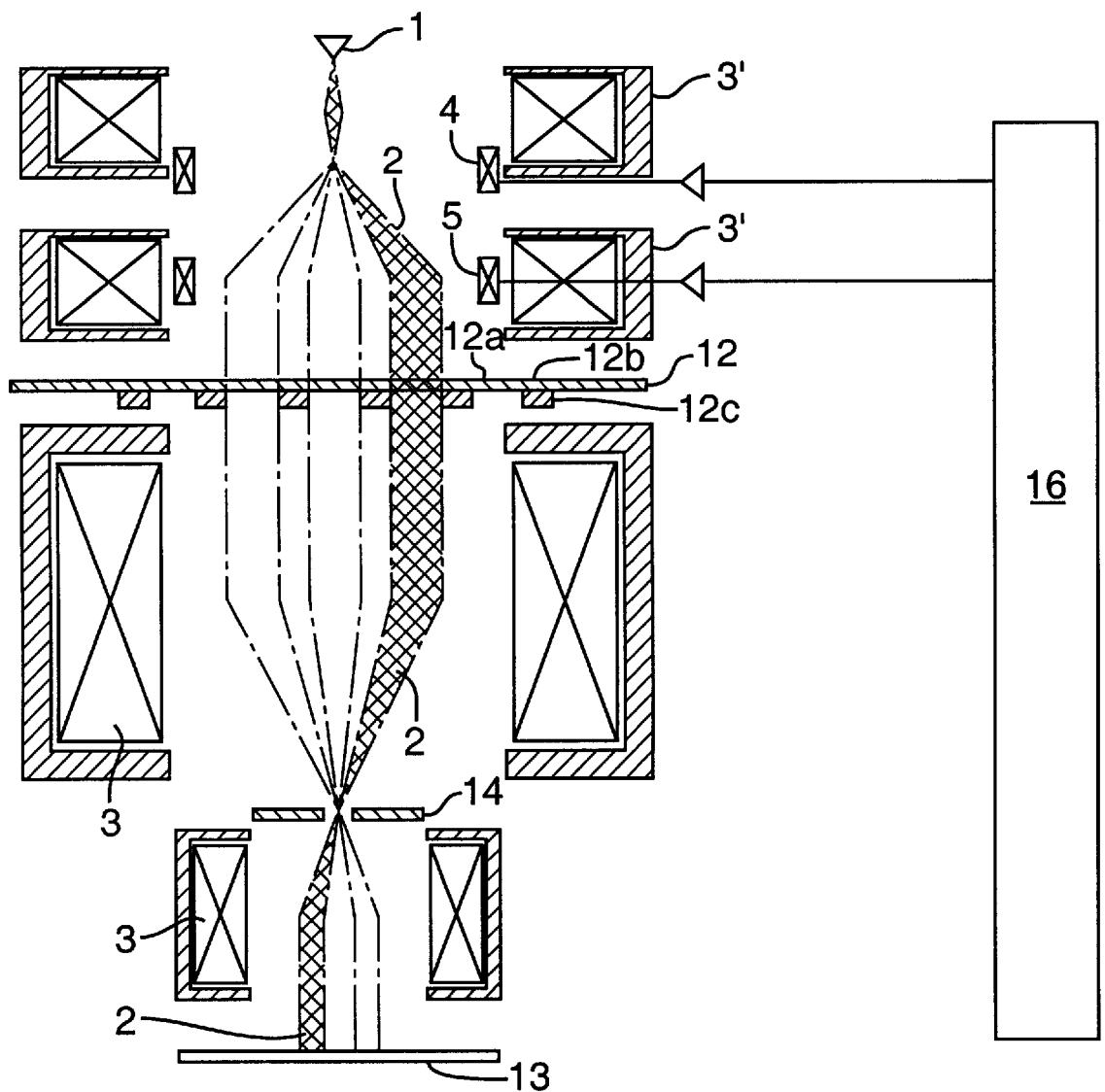
FIG. 3 is a schematic elevational view of a conventional divided projection-exposure apparatus.

FIG. 1 depicts a representative structural configuration of a charged-particle-beam projection-exposure apparatus according to the invention. In FIG. 1, components that are the same as shown in FIG. 3 have the same reference designators. Briefly, the FIG. 1 apparatus comprises a charged-particle source 1 (e.g., electron gun) that produces a charged particle beam 2, an illumination-lens assembly 3', a projection-lens assembly 3, deflectors 4–9, dynamic stigmators 10, and dynamic-focus lenses 11. The FIG. 1 apparatus also comprises a contrast aperture 14, a wafer-height sensor 15, and a computer 16.

Figure 2A:
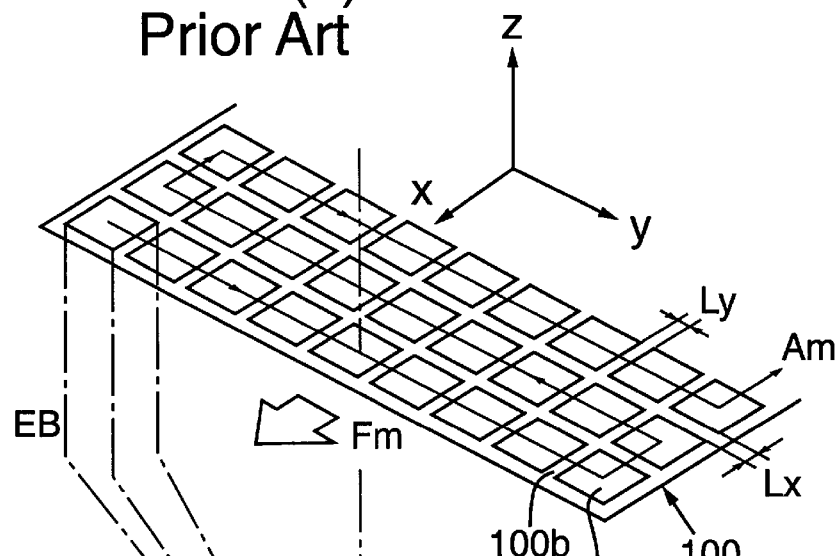
FIGS. 2(a)–2(b) depict general principles of operation of a conventional divided projection-exposure apparatus.
Figure 2B:
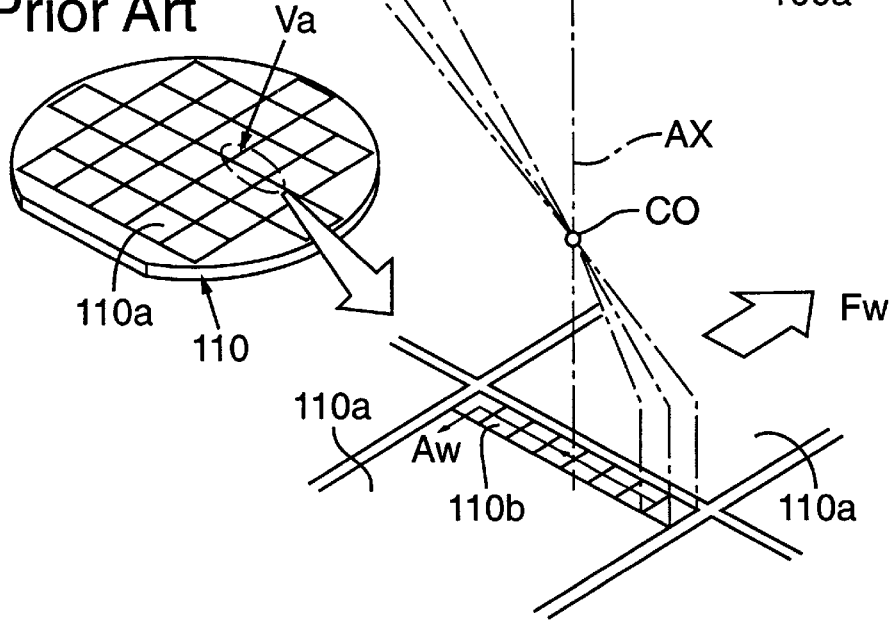

The FIG. 1 apparatus is adapted to be used with a mask 12 and a wafer 13. The mask 12 comprises a mask region 12a defining a corresponding portion of the mask pattern (the region 12a can correspond with the subfield 100a shown in FIG. 2.). The mask 12 can also comprise a boundary region 12b in which no pattern is formed (the boundary region 12b corresponds with the boundary region 100b shown in FIG. 2). The mask 12 can also comprise a support grid 12c that is attached to and coextensive with the boundary regions 12b. The region 12a on the mask can be what is generally known as a "mask subfield"; however, the region 12a is not to be regarded in such a limiting manner. The region 12a can be any region of the die pattern on the mask, such as a region scanned by the charged particle beam.

The charged particle beam 2 emitted from the charged-particle source 1 is collimated by the illumination-lens assembly 3' and irradiated onto the desired region 12a on the surface of the mask 12. To such end, the charged particle beam 2 is appropriately deflected by the deflectors 4, 5 to irradiate the desired mask region 12a. In FIG. 1, the cross-hatched area denotes the charged particle beam 2 that is irradiating a region 12a located on the right side of the mask 12. By changing the excitation currents or impressed voltages routed to the deflectors 4, 5 (depending upon whether the deflectors 4, 5 are electromagnetic or electrostatic deflectors, respectively), a region 12a at the center of the mask 12 can be irradiated, or a region 12a on the left side of the mask 12 can be irradiated.

The charged particle beam 2 passing through the mask 12 forms an image of the irradiated mask region 12a at a corresponding "transfer region" on the surface of the wafer 13 by means of the projection-lens assembly 3. The contrast aperture 14, situated at a crossover position of the charged particle beam, blocks scattered charged particles and thus increases contrast of the projected image on the wafer 13. The charged particle beam passing through the contrast aperture 14 is deflected by a deflector 9 to form an image of the irradiated mask region 12a on a desired location (respective transfer region) on the wafer 13 such that the images of the regions on the wafer form a continuous pattern on the wafer.

To better understand the principles of the invention, a situation is first considered in which electrical-current signals corresponding to the functions $d_{x1}(X_w,Y_w)\cdot g$ and $d_{y1}(X_w,Y_w)\cdot g$ are routed from the computer 16 to the deflector 6; signals corresponding to the functions $d_{x2}(X_w,Y_w)\cdot g$ and $d_{y2}(X_w,Y_w)\cdot g$ are routed to the deflector 7, . . . ; and signals corresponding to the functions $d_{xn}(X_w,Y_w)\cdot g$ and $d_{yn}(X_w,Y_w)g$ are routed to the deflector 9. (These are not the functions shown in FIG. 1, in which the respective functions are of three additional variables Z, I, and s, which are discussed in detail later. The functions $d_{xn}(X_w,Y_w)\cdot g$ and $d_{yn}(X_w,Y_w)g$ are also described in detail later.)

Data from the wafer-height sensor 15 concerning the height Z of the wafer are routed to the computer 16. From this data, the computer 16 calculates functions $F_1(X_w,Y_w,Z,I,s)$, $F_2(X_w,Y_w,Z,I,s)$, and $F_3(X_w,Y_w,Z,I,s)$ of the wafer height "Z", the beam current "I" passing through the pattern features within the selected mask region 12a, and a measure "s" of the dispersion (distribution) of the actual pattern features inside the irradiated mask region. These functions are used by the computer 16 to control energization of respective dynamic-focus lenses 11 (three coils of dynamic-focus lenses 11 are shown in FIG. 1).

In FIG. 1, the functions $F_1(X_w,Y_x,Z,I,s)$, $F_2(X_w,Y_x,Z,I,s)$, and $F_3(X_w,Y_x,Z,I,s)$ are denoted simply as "F1", "F2", and "F3", respectively.

In the functions $F_1$, $F_2$, $F_3$, the coordinates $(X_w,Y_w)$ denote the ideal position (along the x- and y-axes) of the transfer region (corresponding to the irradiated mask region) on the wafer 13. The variable s is expressed, e.g., by Equation (3), below.

$$m_u = \int_\omega up(u,v)dudv \quad (1)$$

$$m_v = \int_\omega vp(u,v)dudv \quad (2)$$

$$s = [\int_\omega ((u-m_u)^2 + (v-m_v)^2)p(u,v)dudv]^{1/2} \quad (3)$$

wherein ω denotes the selected mask region being irradiated; u,v denote the local coordinates at the mask region ω; and p(u,v) is a function having a value of 1 inside the pattern features, and a value of 0 outside the pattern features within the mask region ω. The value $(m_u,m_v)$ corresponds to an average position in the local coordinates (u,v) of the pattern features.

To provide correction of on-axis astigmatism $(SO_x,SO_y)$ image distortion due to the Coulomb effect, and deflection astigmatism, etc., correction signals according to the functions $S_{x1}(X_w,Y_w,SO_x,Z,I,s)$, $S_{y1}(X_w,Y_w,SO_y,Z,I,s)$, $S_{x2}(X_w,Y_w,SO_x,Z,I,s)$, and $S_{y2}(X_w,Y_w,SO_y,Z,I,s)$ are calculated by the computer 16. Electrical currents corresponding to these respective functions are routed to respective dynamic stigmators 10. (The FIG. 1 apparatus preferably comprises two dynamic stigmators as shown. Also, the functions $S_{x1}(X_w,Y_w,SO_x,Z,I,s)$, $S_{y1}(X_w,Y_w,SO_y,Z,I,s)$, $S_{x2}(X_w,Y_w,SO_x,Z,I,s)$, and $S_{y2}(X_w,Y_w,SO_y,Z,I,s)$ are denoted simply as "Sx1", "Sy1", "Sx2", "Sy2", respectively, in the figure.) The actual values of $F_n(X_w,Y_w,Z,I,s)$ (wherein n=1, 2, 3), and $S_{xn}(X_w,Y_w,SO_x,Z,I,s)$ and $S_{yn}(X_w,Y_w,SO_y,Z,I,s)$ (wherein n=1, 2) are adjusted according to measurements of blur and distortion or by computer simulation. This results in reductions of blur and linear distortion caused by deflection, by a change in wafer height, and by the Coulomb effect. (Linear distortion encompasses magnification, rotation, and astigmatic distortion errors of the image on the wafer of the irradiated region of the mask.)

Continuing with this preliminary analysis, consider the situation in which the respective applied currents to the deflectors 6–9 are expressed as the product of functions $d_{x,i}(X_w,Y_w)$ and $d_{y,i}(X_w,Y_w)$ (wherein i=1, 2, . . . , n) for reducing aberrations except for deflection distortion and a function "g" (i.e., $g(X_w,Y_w,Z,I,s)$) for reducing deflection distortion. (Note, the function $g(X_w,Y_w,Z,I,s)$ is denoted in FIG. 1 as simply "g".) The functions $d_{xi}(X_w,Y_w)$ and $d_{yi}(X_w,Y_w)$ (wherein i=1, 2, . . . , n) can be expressed as the following linear equations:

$$d_{xi}(X_w,Y_w) = e_{ix}\cdot X_w + f_{ix}\cdot Y_w$$

$$d_{yi}(X_w,Y_w) = e_{iy}\cdot X_w + f_{iy}\cdot Y_w \quad (4)$$

wherein i=1, 2, . . . , n. In these linear equations, $e_{ix}$, $f_{ix}$, $e_{iy}$, and $f_{iy}$ are linear coefficients. The "g" function is a function of Z,I, and s because the respective excitations of the dynamic-focus lenses 11 and the dynamic stigmators 10 change with changes in Z, I, and s. This results in a positional shift of the beam that requires the above "g" correction.

I.e., according to this preliminary analysis, if Z,I, and s change, only a positional shift imparted to the beam by resulting changes in the excitation of the dynamic-focus lenses 11 and the dynamic stigmators 10 is corrected by uniformly impressing a correction according to the function $g(X_w,Y_w,Z,I,s)$ on the excitation currents applied to the respective deflectors 6–9 located downstream of the mask 12. This correction is especially effective whenever the imaged regions are small, e.g., at most several micrometers square. In such instances, even if the height of the exposure surface is adjusted by the dynamic-focus lenses, or if the on-axis astigmatism is corrected by the dynamic stigmators, the dominant aberration due to such adjustment and correction is a so-termed "main-field" distortion which is a displacement error of the center of the imaged region. I.e., with small regions, it is sufficient to reduce main-field distortion by uniformly impressing a correction according to the function $g(X_w,Y_w,Z,I,s)$ on the signals corresponding to the functions $d_{x1}$, $d_{y1}$, $d_{x2}$, $d_{y2}$, . . . , $d_{xn}$, $d_{yn}$ routed to the deflectors 6, 7, 8, 9.

Hybrid blur and hybrid distortion can arise even if the energizations of the respective dynamic-focus lenses and dynamic stigmators are changed with changes in Z,I, and s. This problem is solved, according to the invention, by making $d_{x1}$, $d_{y1}$, $d_{x2}$, . . . dependent also upon Z,I, and s. In other words, the functions $d_{x1}(X_w,Y_w,Z,I,s)$, $d_{y1}(X_w,Y_w,Z,I,s)$, . . . , are used instead of $d_{x1}(X_w,Y_w)$, $d_{y1}(X_w,Y_w)$, . . . , respectively.

The function $d_{x1}(X_w,Y_w,Z,I,s)$ can be expressed, e.g., by the following Equation (4') instead of Equation (4):

$$d_{x1}(X_w,Y_w) = e_{1x}(Z,I,s)\cdot X_w + f_{1x}(Z,I,s)\cdot Y_w \quad (4')$$

wherein $e_{1x}(Z,I,s)$ and $f_{1x}(Z,I,s)$ are functions of the variables Z,I, and s. For example, the function $e_{1x}(Z,I,s)$ can be expressed by the following linear equation:

$$e_{1x}(Z,I,s) = a_{1x}\cdot Z + b_{1x}\cdot I + c_{1x}\cdot s$$

wherein the coefficients $a_{1x}$, $b_{1x}$, and $c_{1x}$ are determined from measurements and/or computer simulation.

The functions $d_{y1}$, $d_{x2}$, $d_{y2}$, . . . , etc., also can be expressed by similar equations in which the coefficients $X_w,Y_w$ are, respectively, $(e_{1y}(Z,I,s), f_{1y}(Z,I,s))$, $(e_{2x}(Z,I,s), f_{2x}(Z,I,s))$, $e_{2y}(Z,I,s)$ $f_{2y}(Z,I,s)$), ..., respectively. Under conditions in which respective dynamic-focus lenses and dynamic stigmators are energized according to the functions $F_1(X_w,Y_w,Z,I,s)$, ..., $S_{x1}(X_w,Y_w,SO_x,Z,I,s)$, ..., etc., respectively, $e_{1x}(Z,I,s)$, $f_{1x}(Z,I,s)$, $e_{1y}(Z,I,s)$, $f_{1y}(Z,I,s)$, $e_{2x}(Z,I,s)$, $f_{2x}(Z,I,s)$, $e_{2y}(Z,I,s)$, $f_{2y}(Z,I,s)$, ..., etc., can be determined from measurements and/or using a commercial optimization program.

Data from the wafer-height sensor 15 concerning the "height" Z (i.e., position of the wafer along an optical axis, parallel to a z-axis, extending from the charged-particle source 1 through the contrast aperture 14) of the wafer is routed to the computer 16. The computer 16 generates functions $F_1(X_w,Y_w,Z,I,s)$, $F_2(X_w,Y_w,Z,I,s)$ and $F_3(X_w,Y_w,Z,I,s)$ of the wafer height Z, the variable I (i.e., the beam current passing through the pattern features within the irradiated mask region 12a), and the variable "s" denoting the dispersion of the actual pattern features inside the irradiated mask region. Electrical signals corresponding to the respective functions $F_1$, $F_2$, $F_3$ are routed by the computer 16 to respective elements of the dynamic-focus lenses 11 which impart respective adjustments to the beam to make respective corrections of the deflection image-plane distortion, focus shift, magnification shift, and rotational shift arising from changes in wafer height and the Coulomb effect.

Actual equations for the functions $F_1$, $F_2$, $F_3$ can be derived from measurements and/or computer simulation. By way of example, an equation can be approximated using a polynomial expansion such as:

$$F_n(X_w, Y_w, Z, I, s) = \sum_{m=0}^{m=N}\sum_{l=0}^{l=N}\sum_{k=0}^{k=N}\sum_{j=0}^{j=N}\sum_{i=0}^{i=N} (a_{nijklm}) X_w^i Y_w^j Z^k I^l s^m$$

wherein n=1,2,3 and the coefficient $a_{nijklm}$ may be determined by a least-squares fitting technique using data obtained from calculations or measurements.

Similarly, correction signals according to the functions $S_{x1}(X_w,Y_w,SO_x,Z,I,s)$, $S_{y1}(X_w,Y_w,SO_y,Z,I,s)$, $S_{x2}(X_w,Y_w,SO_x,Z,I,s)$, and $S_{y2}(X_w,Y_w,SO_y,Z,I,s)$ can be generated by the computer 16 and routed to the dynamic stigmators 10 in order to correct on-axis astigmatism $(SO_x, SO_y)$, image distortion due to the Coulomb effect, and deflection astigmatism. (The functions $F_1(X_w,Y_w,Z,I,s)$, $S_{x1}(X_w,Y_w,SO_x,Z,I,s)$, etc., are denoted in FIG. 1 as F1, Sx1, etc., respectively.) Equations corresponding to the functions $S_{x1}$, $S_{y1}$, $S_{x2}$, $S_{y2}$, ... can be derived from measurements and/or computer simulation. By way of example, respective equations can be approximated by polynomial expansion in a manner similar to that summarized above for the functions $F_1$, $F_2$, $F_3$.

In contrast to the preliminary analysis discussed above, the functions $d_{x1}(X_w,Y_w,Z,I,s)$, $d_{y1}(X_w,Y_w,Z,I,s)$, $d_{x2}(X_w,Y_w,Z,I,s)$, $d_{y2}(X_w,Y_w,Z,I,s)$, ..., $d_{xn}(X_w,Y_w,Z,I,s)$, $d_{yn}(X_w,Y_w,Z,I,s)$ are generated by the computer 16 instead of the respective functions $d_{x1}(X_w,Y_w)$, $d_{y1}(X_w,Y_w)$, $d_{x2}(X_w,Y_w)$, $d_{y2}$, ..., $d_{xn}(X_w,Y_w)$, $d_{yn}(X_w,Y_w)$ used in the preliminary analysis, and routed as signals to respective deflectors 6–9 to minimize deflection aberrations other than deflection distortion. Thus, the signals routed to the deflectors 6–9 are derived from a function $g(X_w,Y_w,Z,I,s)$ that corrects deflection distortion for wafer height Z, the current I, and the pattern dispersion s.

The functions $d_{x1}$, $d_{y1}$, $d_{x2}$, $d_{y2}$, ..., $d_{xn}$, $d_{yn}$ can be derived from measurements and/or computer simulation. By way of example, respective equations can be approximated by polynomial expansion in a manner similar to that summarized above for the functions $F_1$, $F_2$, $F_3$.

Thus, deflector currents or voltages are optimized by the computer 16 according to the settings of the dynamic-focus lenses 11 and the dynamic stigmators 10 and impressed on the various deflectors 6–9. Such a scheme allows hybrid blur and hybrid distortion to be kept to an extreme minimum even in divided projection-exposure systems.

Equation (4') can be used as a simple format for the function $d_{x1}(X_w,Y_w,Z,I,s)$ Each of the variables $X_w$, $Y_w$, Z, I, and s is independent in this embodiment. However, since the position $(X_w,Y_w)$ has a 1:1 correlation to the position $(X_r,Y_r)$ of the irradiated mask region, the combination of variables $X_r$, $Y_r$, Z, I, s can alternatively be used.

In addition, if the beam-current density at the mask is known by measurement, then I can be found from the percentage of pattern features located inside irradiated mask region, and s can be found from the distribution of features in the region. In such an instance, it is possible to use $(X_r,Y_r,Z)$ instead of $(X_r,Y_r,Z,I,s)$ as a set of independent variables. In the latter case, $d_{x1}(X_r,Y_r,Z)$, $d_{y1}(X_r,Y_r,Z)$, $d_{x2}(X_r,Y_r,Z)$, $d_{y2}(X_r,Y_r,Z)$, ..., which are determined in this way can only be used with a specific mask.

The FIG. 1 embodiment is discussed above in connection with projection-exposure apparatus and methods employing electromagnetic deflectors. However, it will be understood that the principles of this invention can alternatively be applied to apparatus and methods employing electrostatic deflectors. For example, the signal routed to electrostatic deflectors is a voltage signal rather than a current signal. To produce voltage signals, the corresponding digital signals from the computer 16 are routed through a digital-to-analog converter and through a voltage amplifier; the resulting voltage signals are then routed to the electrostatic deflectors.

Therefore, in divided projection-exposure apparatus and methods according to the present invention, the excitation current or voltage applied to each of the deflectors located downstream of the mask is determined by the product of a first function that corrects aberrations except for deflection distortion and a second function that corrects deflection distortion. The first function takes into account the following independent variables: position of the transfer region on the wafer, wafer height, beam current passing through the pattern features located inside the irradiated mask region, and the measure of the pattern-feature distribution in the region. Consequently, hybrid blur and hybrid distortion that accompany deflection of the beam can be minimized to several nm or less, even when the excitation of the dynamic compensators (i.e., dynamic stigmators and dynamic-focus lenses) is changed according to the wafer height Z, beam current I, and pattern-feature distribution s.

In addition, the excitation currents or voltages applied to deflectors located downstream of the mask are determined by the product of a first function that corrects aberrations except for deflection distortion and a second function that corrects deflection distortion. The first function takes into consideration the following independent variables: position of the irradiated mask region, the wafer height, beam current passing through the pattern area inside the irradiated mask region, and the measure of the pattern-feature distribution in the irradiated mask region.

Furthermore, the excitation currents or voltages applied to the deflectors located downstream of the mask is determined as a product of a first function that corrects aberrations except for deflection distortion and a second function that corrects deflection distortion. The first function takes into consideration the following independent variables: the position of the irradiated mask region and the wafer height.

Whereas the invention has been described in connection with multiple representative embodiments, it will be understood that the invention is not limited to those embodiments. On the contrary, the invention is intended to encompass all alternatives, modifications, and equivalents as may be encompassed within the spirit and scope of the invention as defined by the appended claims.

What is claimed is:

1. A method for projecting a pattern, defined by a mask, onto a sensitive substrate, comprising:

(a) providing a mask defining the pattern;

(b) placing the mask in a trajectory of a charged particle beam passing through an illumination-lens assembly so as to selectively cause the charged particle beam to illuminate a desired region of the mask;

(c) passing charged particles of the beam transmitted through the illuminated mask region through a projection-lens assembly, located downstream of the mask, to a sensitive substrate so as to form an image of the illuminated mask region on a selected region of the sensitive substrate;

(d) providing multiple deflectors at respective locations downstream of the mask; and (e) for each of the deflectors, determining a respective energizing current or voltage according to a first function that corrects aberrations except deflection distortion, the first function being of independent variables including coordinates $(X_w, Y_w)$ of an ideal position of the selected region on the substrate corresponding to the illuminated mask region, a height $(Z)$ of the substrate, a beam current $(I)$ passing through the pattern features inside the illuminated mask region, and a measure of the pattern-feature distribution $(s)$ within the illuminated mask region.

2. The method of claim 1, wherein, in step (e), the respective energizing current or voltage is determined additionally according to a second function that corrects deflection distortion, the second function being of independent variables including the coordinates $(X_w, Y_w)$ and Z, I, and s.

3. The method of claim 1, wherein step (c) further comprises passing the charged particles additionally through a dynamic compensator energized with a current or voltage according to a function of $(X_w, Y_w)$, Z, I, and s.

4. The method of claim 3, wherein the dynamic compensator includes a lens and a stigmator.

5. The method of claim 1, wherein each of the deflectors in association with the first projection lens is driven with a current or voltage corresponding to a function $d_{xn}(X_w, Y_w, Z, I, s) \cdot g(X_w, Y_w, Z, I, s)$, wherein n is an integer denoting the respective deflector.

6. The method of claim 5, wherein s is expressed as:

$$s = [\int\int_\omega ((u-m_u)^2 + (v-m_v)^2) p(u,v) du dv]^{1/2}$$

wherein $\omega$ denotes the selected mask region being illuminated; u, v denote local coordinates at the mask region $\omega$; p(u,v) is a function having a value of 1 inside the pattern features and a value of 0 outside the pattern features within the mask region $\omega$; and $(m_u, m_v)$ corresponds to an average position in the local coordinates (u,v) of the pattern features.

7. A method for projecting a pattern, defined by a mask, onto a sensitive substrate, comprising:

(a) providing a mask defining the pattern;

(b) placing the mask in a trajectory of a charged particle beam passing through an illumination-lens assembly so as to selectively cause the charged particle beam to illuminate a desired mask region;

(c) passing charged particles of the beam transmitted through the illuminated mask region through a projection-lens assembly, located downstream of the mask, to a sensitive substrate so as to form an image of the illuminated mask region on a selected region of the sensitive substrate;

(d) providing multiple deflectors at respective locations downstream of the mask; and (e) for each of the deflectors, determining a respective energizing current or voltage according to a first function that corrects aberrations except deflection distortion and a second function that corrects deflection distortion, the first function being of independent variables including a position of the illuminated region on the mask, a height of the wafer, a beam current passing through the pattern features inside the selected region on the mask, and a measure of the pattern-feature distribution within the selected mask region.

8. A method for projecting a pattern, defined by a mask, onto a sensitive substrate, comprising:

(a) providing a mask defining the pattern;

(b) placing the mask in a trajectory of a charged particle beam passing through an illumination-lens assembly so as to selectively cause the charged particle beam to illuminate a desired mask region;

(c) passing charged particles of the beam transmitted through the illuminated mask region through a projection-lens assembly, located downstream of the mask, to a sensitive substrate so as to form an image of the illuminated mask region on a selected region of the sensitive substrate;

(d) providing multiple deflectors at respective locations downstream of the mask; and (e) for each of the deflectors, determining a respective energizing current or voltage according to a first function that corrects aberrations except deflection distortion and a second function that corrects deflection distortion, the first function being of independent variables including a position of the illuminated region on the mask and a height of the wafer.

* * * * *

UNITED STATES PATENT AND TRADEMARK OFFICE
CERTIFICATE OF CORRECTION

PATENT NO. : 6,027,841
DATED : February 22, 2000
INVENTOR(S) : Shohei Suzuki

It is certified that error appears in the above-identified patent and that said Letters Patent is hereby corrected as shown below:

Column 2, line 49, "100b" should be --110b--.

Column 9, line 1, a comma --,-- should be inserted after "$e_{2y}(Z,l,s)$".

Column 10, line 8, a period --.-- should be inserted at the end of the sentence.

Signed and Sealed this

Fifteenth Day of May, 2001

*Attest:*

NICHOLAS P. GODICI

*Attesting Officer*  *Acting Director of the United States Patent and Trademark Office*